(12) United States Patent
Tan et al.

(10) Patent No.: US 6,911,833 B2
(45) Date of Patent: Jun. 28, 2005

(54) ELECTROMAGNETICALLY SHIELDED TEST CONTACTOR

(75) Inventors: Fern Nee Tan, Penang (MY); Suk Yeak Lai, Penang (MY); Tark Wooi Fong, Penang (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/015,980

(22) Filed: Dec. 13, 2001

(65) Prior Publication Data

US 2003/0111264 A1 Jun. 19, 2003

(51) Int. Cl.[7] .............................................. G01R 1/04
(52) U.S. Cl. ..................................... 324/754; 324/755
(58) Field of Search ................................ 324/765, 754, 324/755, 761, 762, 158.1; 439/66–90

(56) References Cited

U.S. PATENT DOCUMENTS

| | | | | |
|---|---|---|---|---|
| 4,825,155 A | * | 4/1989 | Takamine | .................... 324/755 |
| 5,659,245 A | * | 8/1997 | Ping et al. | ................ 324/158.1 |
| 5,828,224 A | * | 10/1998 | Maruyama | ................... 324/755 |
| 6,127,833 A | * | 10/2000 | Wu et al. | .................... 324/755 |

* cited by examiner

Primary Examiner—Vinh P. Nguyen
(74) Attorney, Agent, or Firm—Blakely, Sokoloff, Taylor & Zafman LLP (57) ABSTRACT

A shielded test contactor to electrically couple a device to be tested to test circuitry, comprises conductive material covered by or embedded in non-conductive material and defining a well to receive the device. Contacts extend from the embedded conductive material to connect the embedded conductive material to ground. Preferably, the contacts are extensions of the conductive material, through the non-conductive material. A second non-conductive material is preferably provided to support the embedded conductive material and define a floor of the well. Electrical connectors are preferably also supported by the second non-conductive material adjacent to the well, to electrically couple the device to test circuitry. For example, the connectors may be pins supported by the second non-conductive material and extending into the well. Preferably, the height of the conductive material defining the well is at least twice the height of the device to be tested.

19 Claims, 9 Drawing Sheets

ELECTROMAGNETICALLY SHIELDED TEST CONTACTOR

FIELD OF THE INVENTION

A test contactor to couple a device under test to test circuitry, and more particularly, a shielded test contactor that grounds intercepted electromagnetic emissions.

BACKGROUND OF THE INVENTION

Electronic devices, such as microprocessors, are tested during and after manufacturing to ensure that performance, quality and reliability requirements are met. Missing parts, malfunctioning components, incomplete soldering, incomplete traces of conductive material and cosmetic problems, for example, may be found. Units failing the test may be repaired or discarded.

Figure 1:
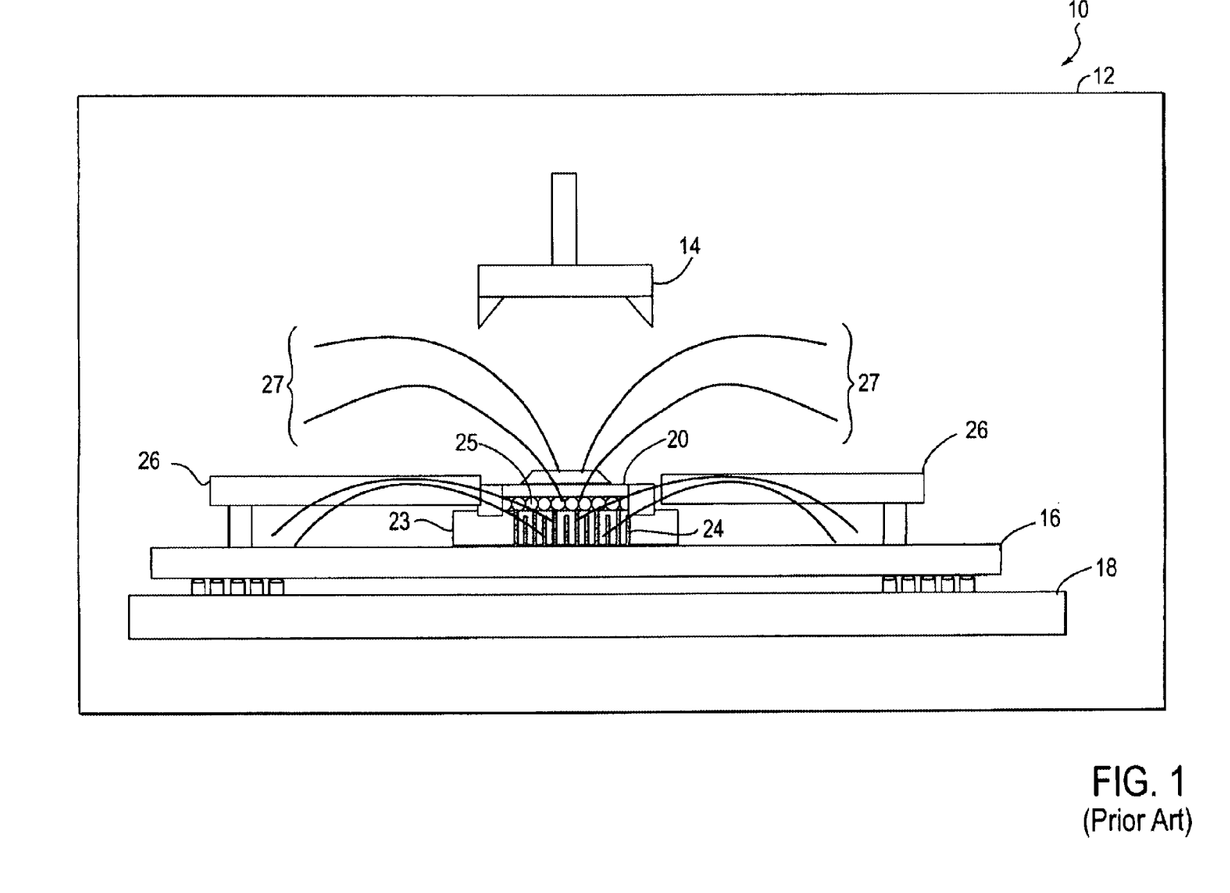
FIG. 1 is a schematic representation of a common test system.

Automated testing is commonly used in the high volume manufacturing of electronic components, such as microprocessors. FIG. 1 is a schematic representation of a common test system 10 including a tester 12 containing a handler 14, a test interface unit ("TIU") 16, a docking station 18 and a device under test ("DUT") 20. A test contactor 23 supports contacts 24 that electrically couple contacts on the DUT 20 to the TIU 16. The test contactor typically has a plastic housing. The handler 14 automatically loads the DUT onto the contacts 24 of the test contactor 23 and removes the DUT 20 when the test is completed. Here, the DUT 20 is a microprocessor for a wireless device and the contacts of the DUT 20 are in the form of a ball grid array (BGA) 25. The TIU 16 is a printed circuit board ("PCB") that electrically couples the DUT 20 to test circuitry, here, the tester 12. The TIU 16 typically comprises electrical channels (microstrips) and electronic devices such as capacitors. The TIU 16 is supported on the docking station 18. Under software control, the tester 12 provides signals to the DUT 20 and evaluates the signals generated by the DUT 20 in response to the test signals, to determine whether the DUT 20 is operating properly, as is known in the art. Multiple DUTs 20 may be simultaneously evaluated in the Tester 12.

Electromagnetic emissions from the DUT 20 and traces on the TIU 16 may cause electromagnetic interference ("EMI") that can corrupt the signals on the TIU 16, preventing analysis of the results. EMI can be a particularly serious problem with electronic components, such as microprocessors, for use in wireless devices. To shield the DUT 20, a thick aluminum plate 26 is provided over the TIU 16. The plate covers about three fourths (¾) of the area of the TIU 16 and has openings over the test contactor 23 to receive the DUTs 20. One such opening for receiving one DUT 20 is shown in FIG. 1. Exemplary paths 27 of electromagnetic flux 28 emitted by the DUT 20 are shown in FIG. 1. Only a small portion of the flux lines are intercepted by the aluminum plate 26. The unscreened flux may interfere with the signals received from and returned to the TIU 16, as well as with other DUTs being tested. Since the housing of the test contactor 24 is typically a plastic, non-conductive material, electromagnetic flux from the environment could also penetrate the housing and interfere with the test signals. For example, electromagnetic flux that may interfere with testing may be emitted by cellular phones, by nearby airports and by other equipment on the test floor. In addition, the removal and installation of the aluminum plate 26 is cumbersome and delays the testing process.

An improved shielding system that more effectively blocks EMI during testing would be advantageous.

DETAILED DESCRIPTION OF THE PREFERRED EMBODIMENTS

Figure 2:
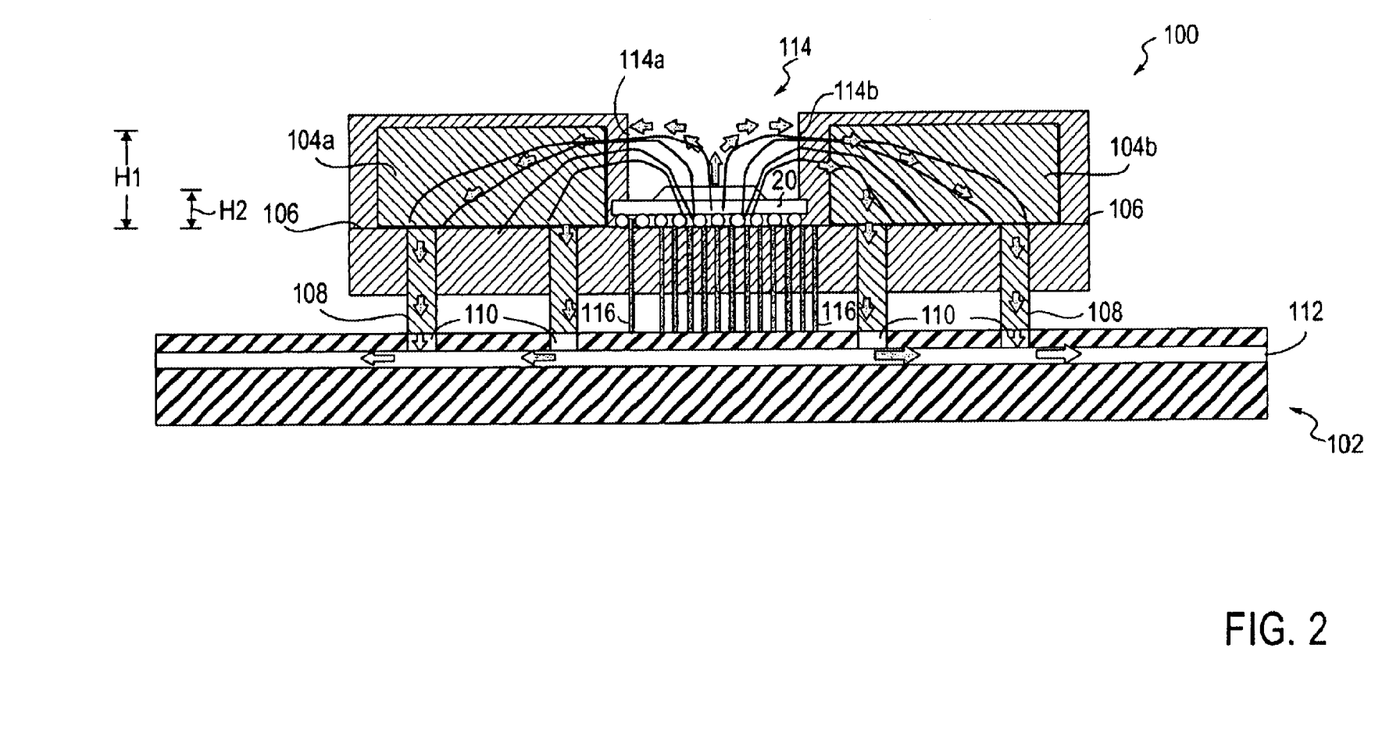
FIG. 2 is a cross-sectional schematic representation of an electromagnetic emissions shielded test contactor connected to a test interface unit, illustrating the principles of operation of the invention.

FIG. 2 is a cross sectional, schematic representation of an electromagnetic emissions shielded test contactor 100 connected to a TIU 102 in accordance with one embodiment of the invention, illustrating the principles of the operation of the invention. The test contactor 100 comprises conductive material 104a, 104b covered or embedded in non-conductive material 106. Two sections of embedded conductive material 104a, 104b are shown. The sections 104a, 104b may be separate or connected by embedded conductive material. Grounding contacts or posts 108, preferably of the same material as the embedded conductive material 104, extend from each section 104a, 104b of the embedded conductive material, through the non-conductive material 106. The grounding posts 108 are in electrical contact with vias 110 in the TIU 102. The vias 110 are electrically connected to the ground plane 112 of the TIU 102. A well 114 is defined by one or more walls 114a, 114b of the embedded conductive material, between the sections 104a, 104b, to receive the DUT 20. Electrical connectors or contacts 116 are provided in the well to electrically couple the DUT 20 to the TIU 102. In this example, the DUT 20 is a microprocessor for use in wireless applications, with ball grid array (BGA) electrical contacts. The electrical contacts 116 are pins extending through the non-conductive material 106 and into the well 114, to make contact with the BGA contacts of the DUT 20. Other types of devices with other types of electrical connectors may be tested in the test contactor 100. Appropriate electrical contacts 116 may be provided in the test contactor 100 for the particular type of device to be tested.

The conductive material 104 and the posts 108 provide a low impedance path to the ground plane 112. As shown in FIG. 2, electromagnetic flux emitted by the DUT 20 and intercepted by the embedded conductive material 104, and current induced in the embedded conductive material by the flux, are directed to the ground plane 112 of the TIU 102. The flux and current are thereby removed from the environment of the DUT 20 and TIU 102 without interfering with the operation of the TIU 102 or the testing of other DUTs. The height "H1" of the conductive material 104a, 104b of each section is preferably greater than the height "H2" of the DUT 20. The greater the height H1, the more flux intercepted. Therefore, it is more preferred that the height H1 be at least about 50% greater than the height H2 and even more preferred that the height H1 be at least about 75% greater than the height H2. To intercept a significant amount of flux, the height "H1" of the embedded conductive material 104a, 104b is most preferably at least about twice the height "H2" of the DUT 20.

Preferably, the well 114 is substantially surrounded on all sides by the embedded conductive material 104 to intercept flux emitted in all directions. The conductive material 104 is embedded in non-conductive material 106 to prevent direct contact of the DUT 20 with the conductive material, to avoid short circuiting of the DUT 20. In addition, embedding the conductive material prevents coupling with electrical channels (microstrips) of the TIU 102, some of which may pass beneath the test contactor 100. The embedded conductive material 104 is also preferably as close as possible to the DUT 20. It is preferred not to completely surround the well, however, to prevent reflections of electromagnetic flux within the well. Such reflections could set up resonance patterns within the well that could interfere with the testing of the DUT 20. The conductive material 104a, 104b also intercepts and grounds EMI from the environment. As mentioned above, the sections of embedded conductive material may be separate or connected by embedded conductive material. Preferably, the sections 104a, 104b are connected so that the entire region of embedded conductive material has the same potential. If separated, each section must have its own grounding post 108. It is preferred that each section 104a, 104b include a grounding post 108 even if the sections are connected. A space small space (about 1 mm) is provided between the test contactor 100 and the TIU 102, to accommodate the electrical traces (microstrips) on the TIU 102 that traverse underneath the test contactors 100 to connect to at least some of the electrical contacts 116.

Figure 3:
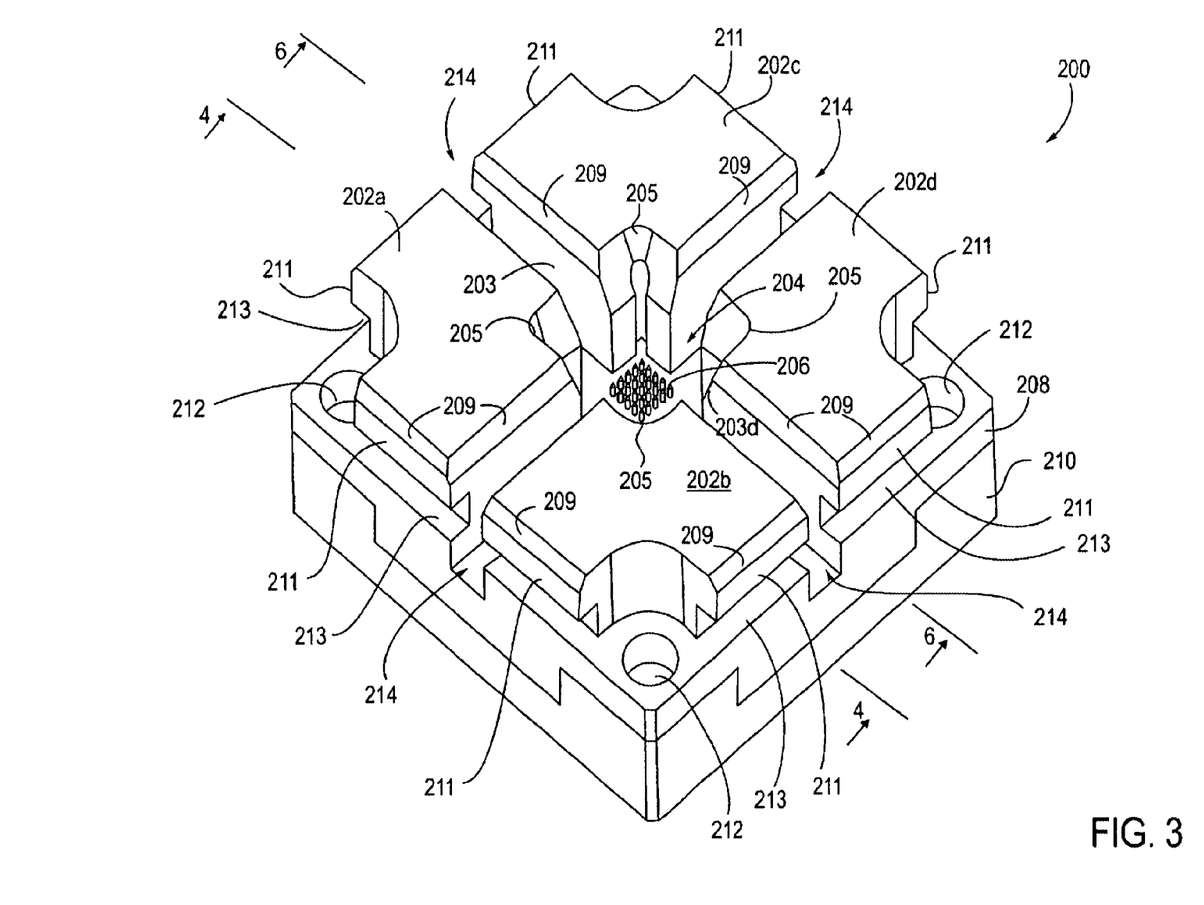
FIG. 3 is a perspective view of a test contactor in accordance with a preferred implementation.

FIG. 3 is a perspective view of a test contactor 200 in accordance with a preferred implementation. Four blocks 202a, 202b, 202c, 202d containing embedded conductive material have walls 203 defining a well 204 for receiving the DUT 20 (not shown). The edge 205 of each block 202 adjacent to the well 204 is preferably tapered to assist in the placement of the DUT 20 by a handler 14. (See FIG. 1). A taper of about 30 degrees may be used, for example. Contact pins 206 extend into the well 204, to make contact with BGA contacts of the DUT 20, for example. Embedded conductive material 208 extends around the periphery of the test contactor 200, connecting the four blocks 202. The four blocks 202 and the embedded conductive material 208 are supported by abase layer 210 of non-conductive material. The blocks 202 preferably have overhanging ledges 211 defining a groove 213, enabling the test contactor 200 to be secured to the TIU 102 by a clamp (not shown), if desired. The upper edge 209 of each block 202a, 202b, 202c, 202d is preferably tapered to avoid sharp edges. Openings 212 are shown for screwing the test contactor 200 to the TIU 102. If screws of conductive material are used, they are preferably coated with non-conductive paint. The blocks 202 may be connected to the base layer 210 by screws, as well.

Figure 4:
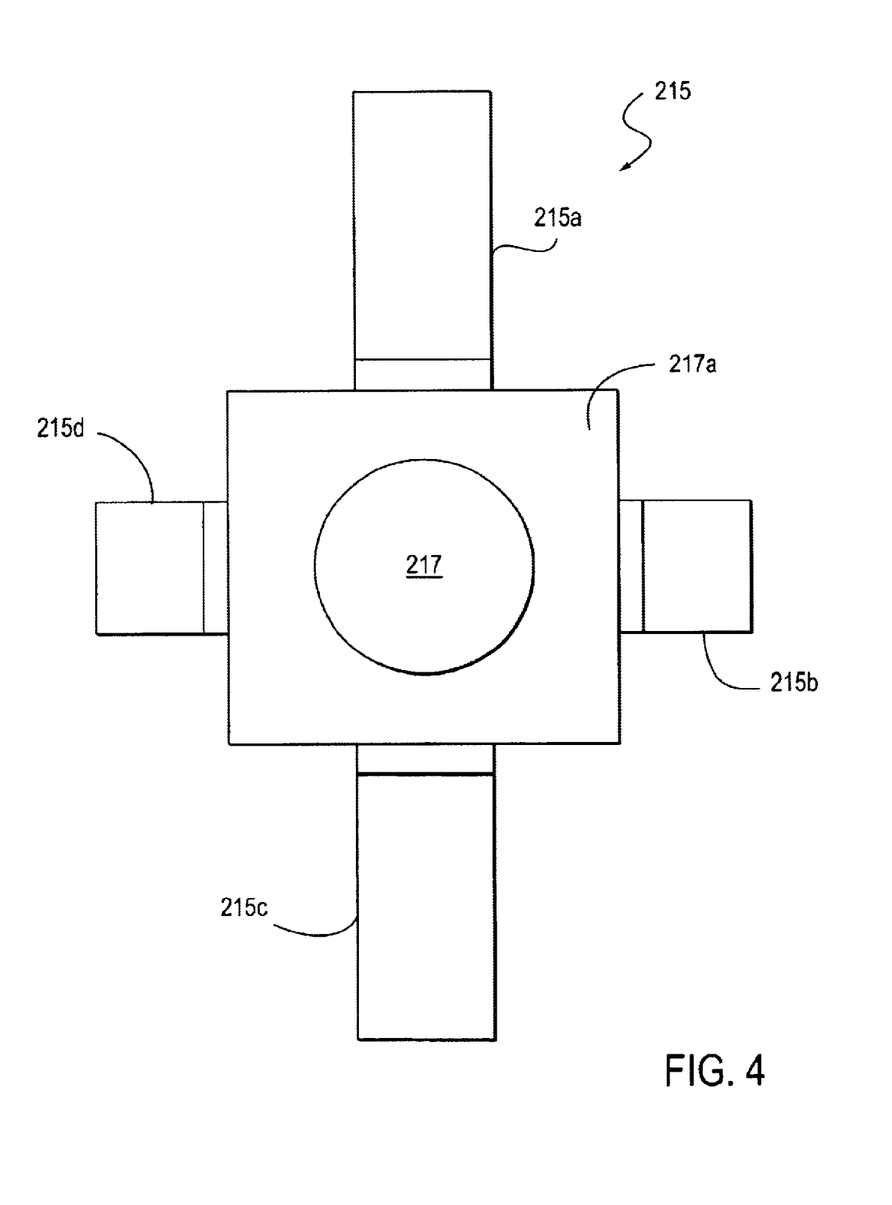
FIG. 4 is a top view of a chuck that can be used with the test contactor of FIG. 3.

Passages 214 are preferably provided between the four blocks 202 to allow for the escape of some EMI from the well 204. As mentioned above, it is preferred not to completely surround the well 204 by embedded conductive material. In addition, the passages 214 allow for the insertion of a chuck in the handler 14 into the well 204, to place the DUT 20 in position for testing. The chuck also provides the necessary contact force between the BGA of the DUT 20 and the pin contacts 206 and removes the DUT 20 from the well 204 when the test is complete. FIG. 4 is a top view of an example of a chuck 215 that can be used with the test contactor 200. The chuck 215 comprises arms 215a, 215b, 215c, 215d, for receipt in the passages 214. An opening 217 is provided in the center region of the chuck 215, for connection to an air pipe. Suction is applied through the air pipe to engage the DUT 20. The region 217a around the opening bears against the DUT 20 when the DUT is in the well 204, to provide sufficient contact force between the electrical contacts of the DUT and the electrical contacts 206 of the test contactor 200 during testing. The tapered edges 209 along the passages 214 also assist in the placement of the chuck 215 and the DUT 20 into the well 204.

Figure 5:
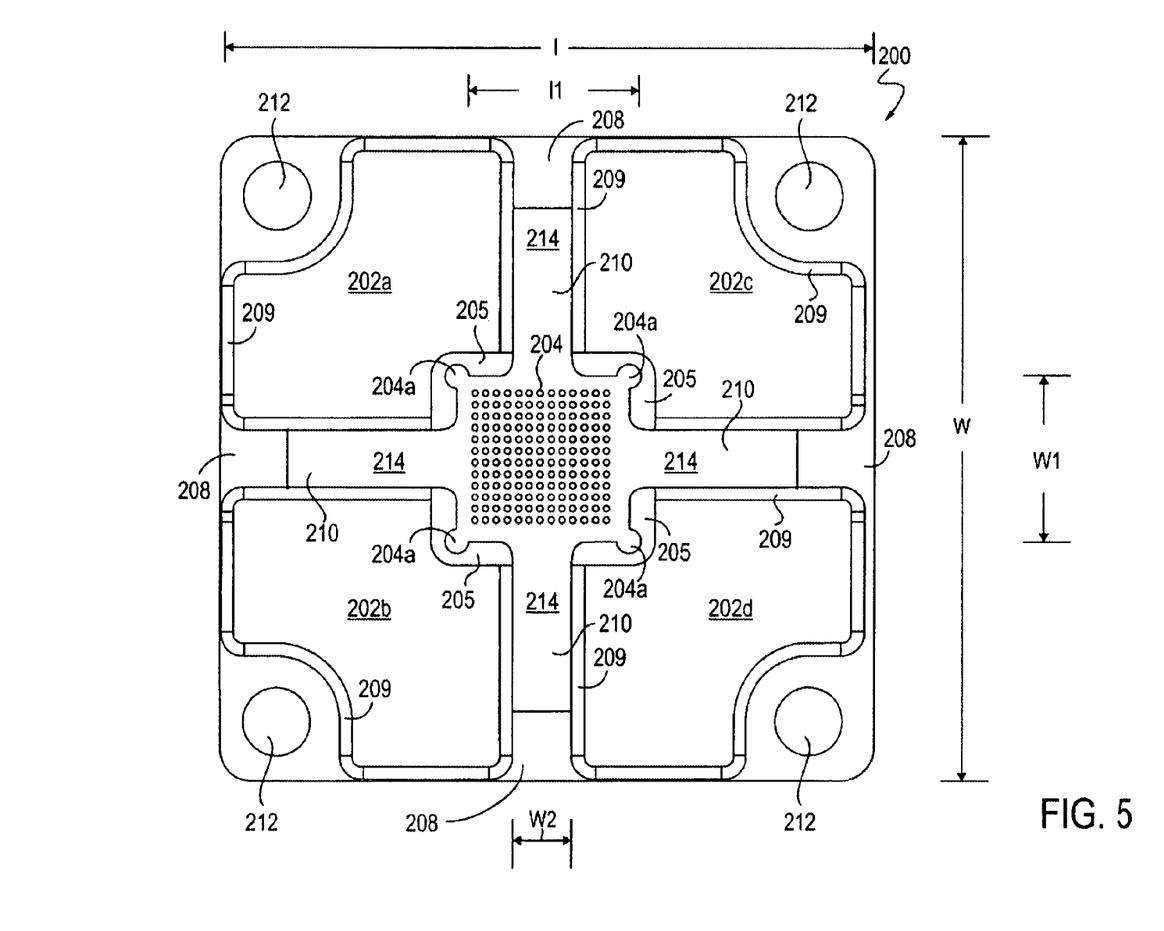
FIG. 5 is a top view of the test contactor of FIG. 3.

FIG. 5 is a top view of the test contactor 200 of FIG. 3, better showing the well 204 and the periphery 208 of embedded conductive material. The electrical contacts 206 are not shown in this view. Instead, the array of openings 207 for the electrical contacts 206 through the non-conductive base layer 210 are shown. The bottom of the passages 214 is defined by an exposed surface of the non-conductive base layer 210 and the embedded conductive material 208. The corners 204a of the well 204 are preferably relieved to provide additional clearance with the corners of the DUT 20.

Figure 6:
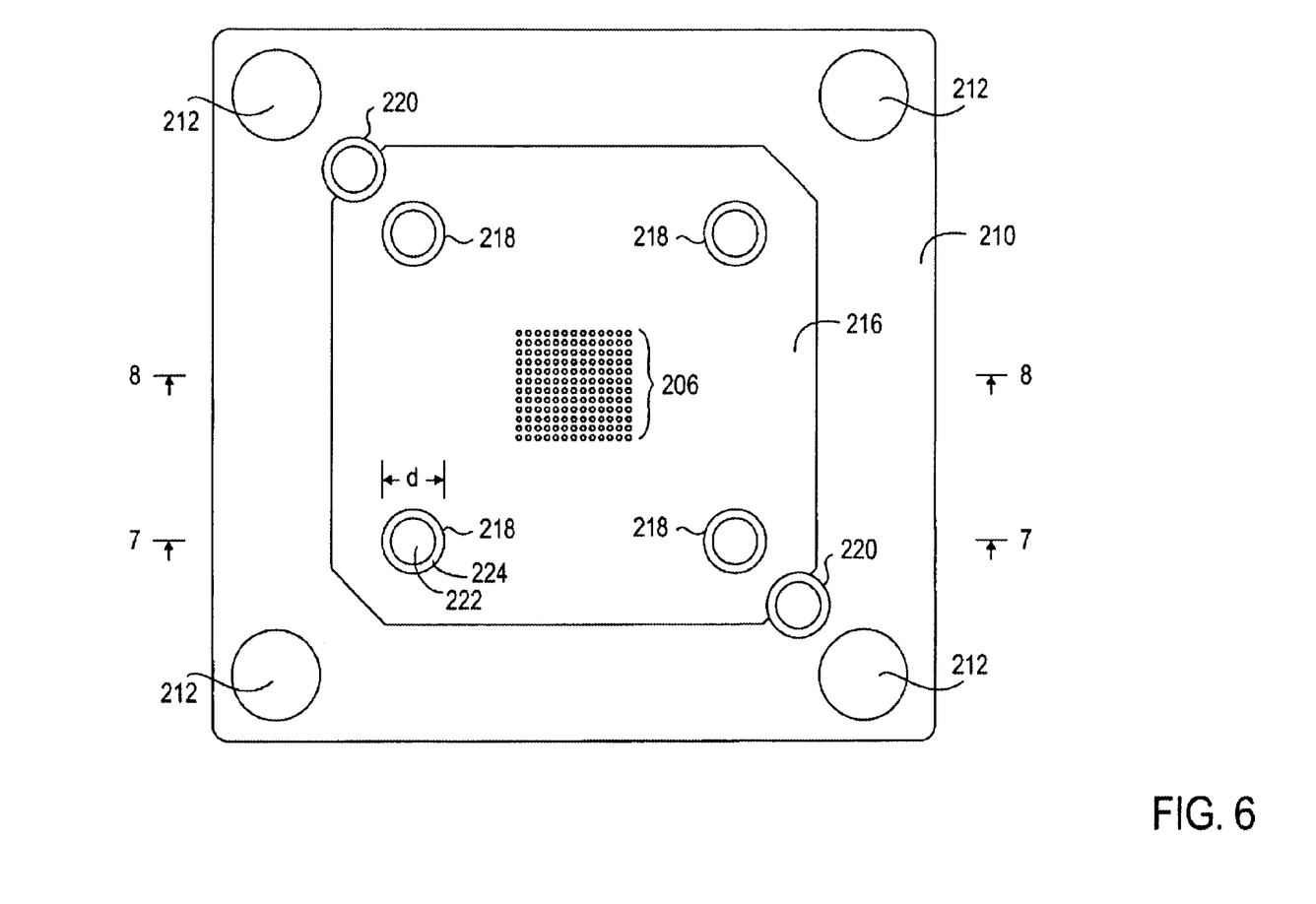
FIG. 6 is a bottom view of the test contactor of FIG. 3.

FIG. 6 is a bottom view of the test contactor 200 of FIG. 3, showing the bottom of the base layer 210 of non-conductive material and a bottom plate 216, also of non-conductive material. The bottom plate 216 comprises an array of openings that support the contacts 206. The contacts 206 protrude into and out of the page in this view. Four grounding posts 218, one extending from each of the four blocks 202, extends through the bottom plate 216. As discussed above, the grounding posts 218 connect the embedded conductive material in each block 402 to the ground plane 112 of the TIU 102 (See FIG. 2) when the test contactor 200 is positioned on the TIU. Preferably, the grounding posts 218 comprise the same conductive material 222 as the blocks 202a, 202b, 202c, 202d and are integral with the conductive material to prevent mismatches that could increase the impedance of the path from the embedded conductive material 222 to the ground plane 112 of the TIU 102. The periphery of the grounding posts 218 are embedded in the same non-conductive material 224, to prevent contact or coupling with the electrical traces (microstrips) on the TIU 102. Some of those channels may extend beneath the test contactor 200 when the contactor is attached to the TIU 102. The conductive material 222 at the bottom surfaces of the grounding posts 218 are exposed to make contact with the vias. Two alignment posts 220 also preferably extend from the base layer 210 for insertion into openings in the TIU 102 to align the test contactor 200. The bottom plate 216 may be screwed or otherwise connected to the base layer 210.

Figure 7:
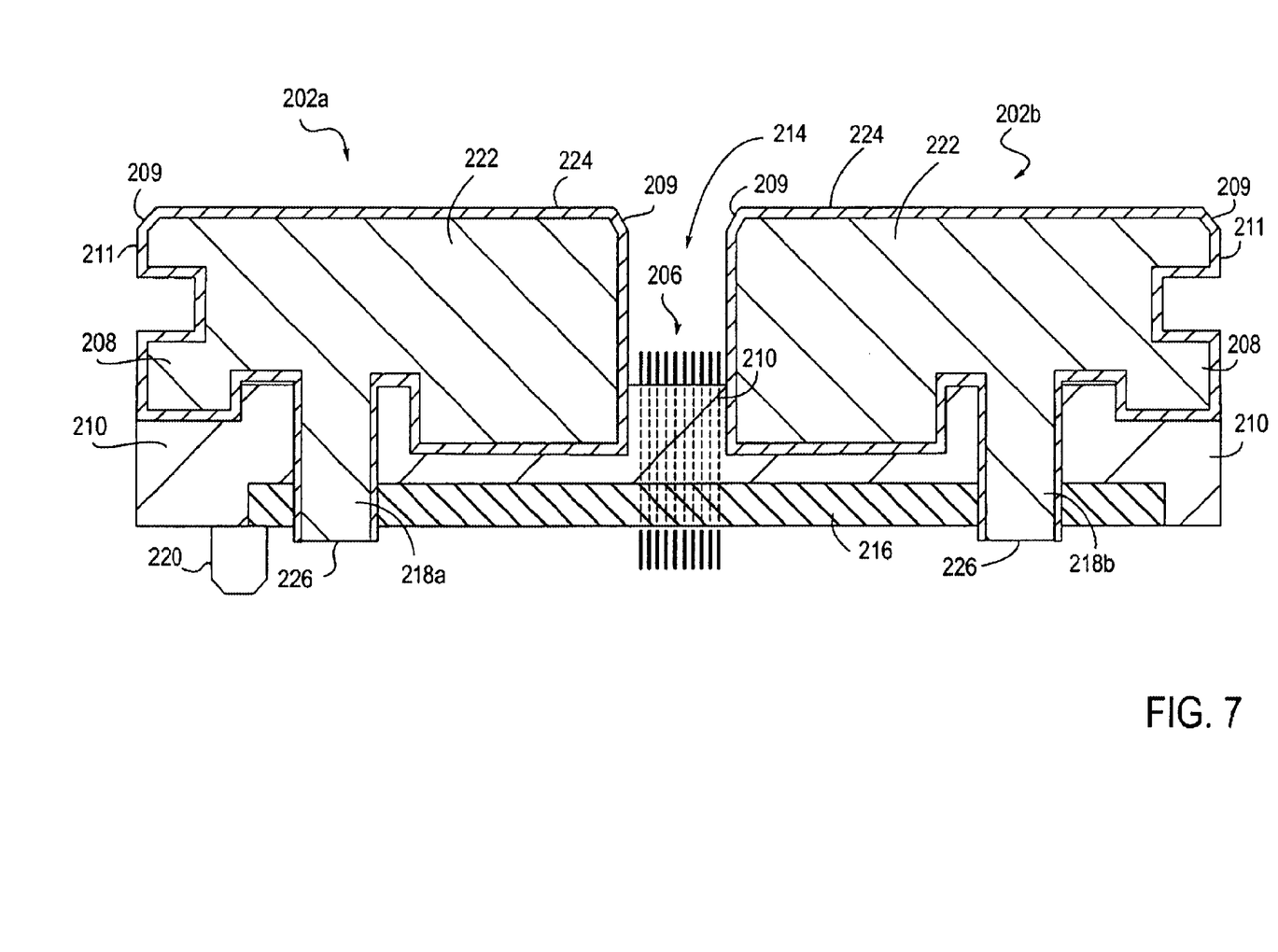
FIG. 7 is a side, cross-sectional view of the test contactor through line 7—7 of FIG. 6.

FIG. 7 is a side, cross-sectional view through line 7—7 in FIG. 6, showing two adjacent conductive blocks 202a, 202b. Each block 202a, 202b comprises conducting material 222. The conducting material 222 is embedded and surrounded by non-conducting material 224. The embedded conductive material 208 extending around the periphery of the test contractor 200 is also shown. The grounding posts 218a, 218b extending from each block 202a, 202b, respectively, are shown as well, extending through the base layer 210 and the bottom plate 216. The side surfaces of the grounding posts 218a, 218b are surrounded by the non-conductive material 224 but the bottom surfaces 226 of each post are not, so that the grounding posts may make electrical contact with the vias 110 on the TIU 102. (See FIG. 2). One of the alignment posts 220 is also shown.

Figure 8:
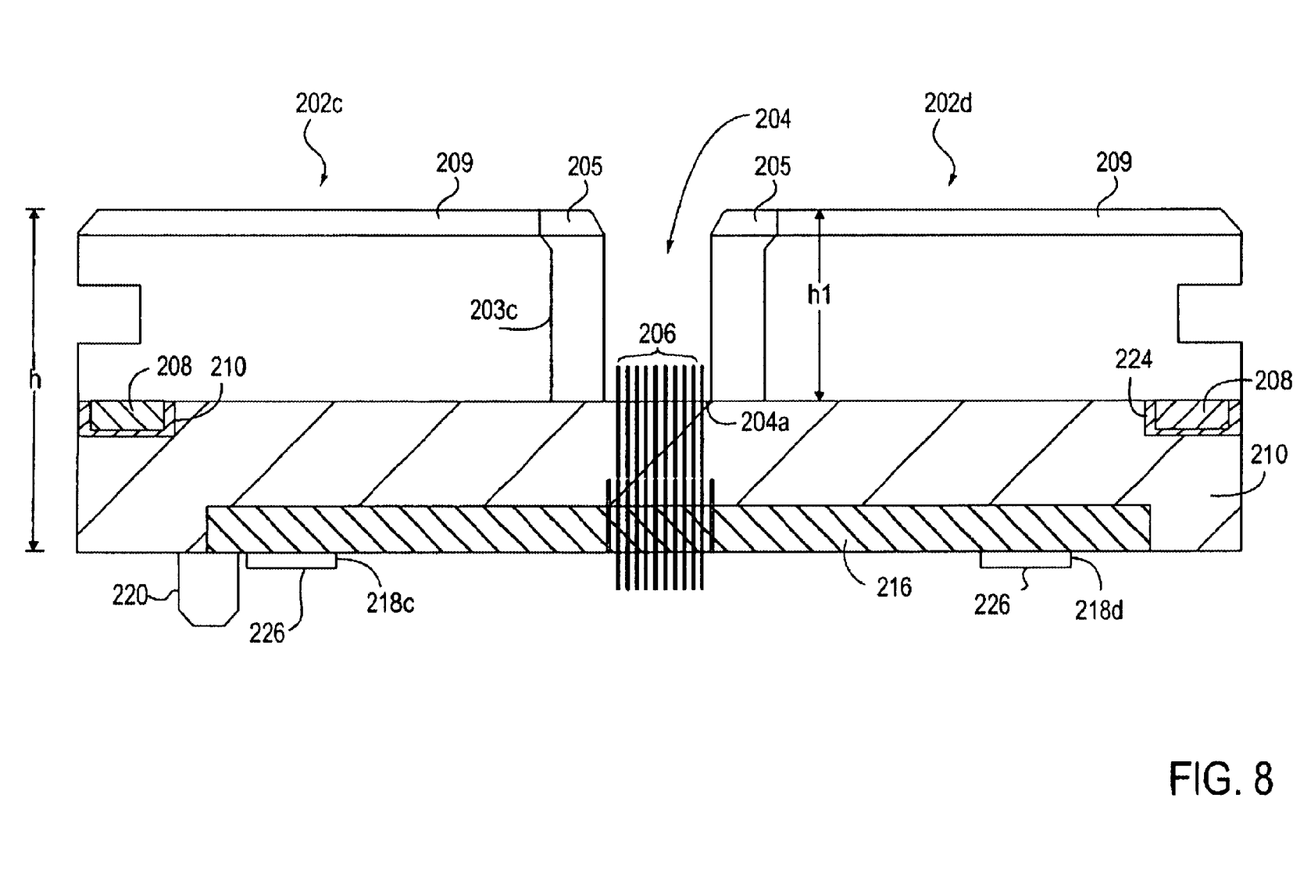
FIG. 8 is a side, cross-sectional view of the test contactor through line 8—8 of FIG. 6.

FIG. 8 is a side cross-sectional view through line 8—8 of FIG. 6, showing the two rear conductive blocks 202c, 202d, walls 203c, 203d defining in part the well 204, and the grounding posts 218c, 218d. The well 204 is shown, as well. The bottom of the well 204 is defined by an exposed surface of the non-conductive base layer 210.

A test contactor 200 for use in testing a DUT 20 having a height of about 1.2 mm and a length and width of about 7.0+0.05 mm, for example, may have a length "l" and width "w" of about 28 mm (see FIG. 5) and a height "h" of about 6.95 mm. (See FIG. 7). The well 204 may have a length "l1" and width "w1" of about 7.08 mm. Each passage 214 may have a width "w2" of 2.5 mm. The tips of the electrical contact pins may extend about 0.45 mm into the well 204. The height "h1" of the well 204 in FIG. 7 is preferably about 4.5 mm, more than double the height of the DUT 20. The grounding posts 218 may protrude about 0.02 mm from the bottom plate 216. Essentially the entire height h1 comprises the conductive material 222. The diameter of the grounding posts 218 is preferably wide, lessening resistance. A diameter "d" of about 2 mm+/−0.05 mm is appropriate. (See FIG. 6) The vias 110 in the TIU 102 (see FIG. 2) are gold or nickel plated cylinders having an inner diameter of about 1.016 mm and an outer diameter of about 1.524 mm, for example. The bottom surfaces 226 of the grounding posts 218 rest on and contact the cylinders. The alignment posts 220 preferably protrude about 1.08 mm from the bottom plate 216.

The embedded conductive material 222 is preferably aluminum. Other conductive materials, such as iron, steel, copper and gold, may be used, as well. The layer 208 of embedded conductive material may be readily replaced by another layer of embedded conductive material having different dimensions for use with a DUT having different dimensions. The layer 208 may also be replaced by a layer having a different embedded conductive material, if desired.

The embedded conductive material 222 is preferably formed by milling aluminum to a desired shape and anodizing the surface of the aluminum in an electrolytic solution to form a non-conductive coating of a metal oxide integral with the conductive material. The coating is very resistant to wear. When the conductive material is aluminum, the thickness of the anodized layer of non-conductive material 224 is preferably from about 35 microns to about 50 microns. In the test contactor 200 of FIG. 3, since the bottom surface of the conductive material 222 is supported and insulated by the base layer 210 of non-conductive material, it is not necessary that that bottom surface be anodized. However, it is preferred to anodize the entire surface of the conductive material 222 to simplify the manufacturing process. The anodized layer may be removed from the bottom surfaces 226 of the grounding posts 218 by machining, for example, to expose the conductive material.

Suitable anodized aluminum may be provided by Microplasmic Corporation, Peabody, Mass., for example. According to Microplasmic Corporation, the aluminum sample is submerged in an alkaline electrolytic solution and a controlled high power AC current is applied. A micro arc is created by the surrounding plasma that oxidizes the surface of the aluminum sample. See, for example, U.S. Pat. No. 6,197,178. The coating is said to be an electrical insulator up to 700 volts, and to have an electrical resistivity (lower limit) of 5E+10 ohm-cm, a hardness (Vickers) of 1300, a shear strength of 7 MPa (1,015 psi) and a maximum service temperature of 1650 degrees centigrade (with cooling).

While anodizing aluminum is preferred, the conductive layer 224 may be formed by other methods. When other conductive materials are used, other processing techniques for forming integral, non-conductive coatings may be used. In addition, the aluminum or other conductive materials may be dipped in a solution of non-conductive material.

The base layer 210 and the bottom plate 216 may be molded of an engineering plastic, such as polyetherether ketone ("PEEK"), for example. Suitable PEEK may be obtained from Boedeker Plastics, Inc. Shriver, Tex., and Victrex® Plc., Lancashire, U.K., for example. The PEEK may be a natural, unfilled PEEK, for example.

The pin contacts 206 are preferably spring loaded contact pins, such as single or double ended probe pins. Appropriate probe pins are YPW-7XT02-034 probe pins, available from Yokowo Company, Limited, Tokyo, Japan, for example. Other types of electrical connectors may be used, as well. The type of connector may depend on the electrical contacts of the DUT 20. For example, if the DUT 20 has pin connectors, the electrical contacts 206 can be female connectors embedded in the portion of the base layer 210 of non-conductive material below the well 204, as is known in the art. The female connectors can include pin actuators, as is also known in the art.

Figure 9:
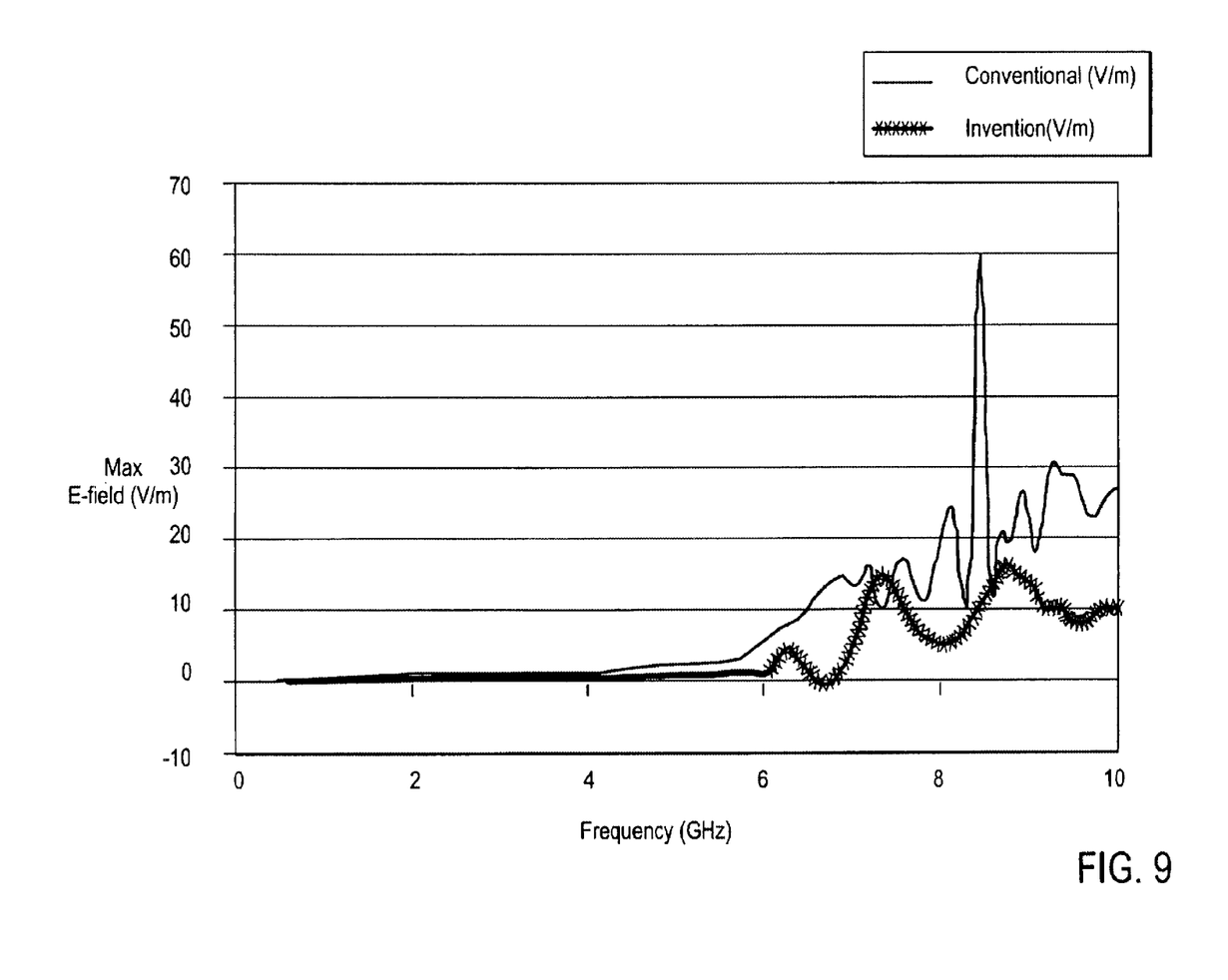
FIG. 9 is a graph of the results of a simulation comparing the shielding effectiveness of the aluminum plate of FIG. 1 and the test contactor of FIG. 3.

The shielding effectiveness of the aluminum shielding plate 26/test contactor 23 of FIG. 1 and the test contactor 200 of the present invention were compared by simulation using Ansoft HFSS, a 3D Full Wave field solver tool from Ansoft Corp, Pittsburgh, Pa. In the simulation, an ideal, isotropic emission source (monopole) generated an equal amount of EMI inside each test contactor. The maximum electric field that escaped from each contactor was collected at a distance of 1 meter. The results are shown in the graph of FIG. 9, where the conventional shielding plate is indicated by a solid line and the test contactor 200 of the invention is indicated by "Xs".

In the simulation, the test contactor 200 of the present invention achieved higher shielding effectiveness than the conventional shielding approach. The test contactor 200 of the present invention had a shielding effectiveness of up to 50 V/m at 8.5 GHz and an average shielding effectiveness of 7.7 V/m. The test contactor 200 provided significant improvement in shielding effectiveness from about 4.5 GHz to about 10 GHz. It is therefore believed that the test contactor 200 of the present invention would be highly effective for high frequency testing up to 10 GHz and above. It is noted that at certain frequencies (about 7.2 GHz and about 8.5 GHz), resonances between the test contactor 200 of the invention and the DUT 20 limited shielding effectiveness to the same or less than that of the aluminum plate 26 of the prior art. Despite this, the invention decreased the incidence of resonance and provided much better shielding overall, than the prior art.

It will be apparent to one skilled in the art that modifications may be made to the embodiments described herein without going beyond the scope of the present invention, which is defined in the claims below.

We claim:

1. A test contactor comprising:
    a base layer having at least one conductive post extending therethough;
    at least one block on the base layer comprising a conductive material and a first non-conductive material covering the conductive material, the at least one block defining at least one wall of a well to receive a device to be tested, a surface of the base layer defining a floor of the well, the conductive material being connected to the at least one conductive post; and a plurality of electrical connectors supported by the base layer and adjacent to the well to electrically couple the device to be tested to test circuitry.

2. The test contactor of claim 1, wherein the base layer comprises a second non-conductive material.

3. The test contactor of claim 1, wherein the electrical connectors are pins extending into the well.

4. The test contactor of claim 1, wherein the device to be tested has a first height and the wall of the well has a second height greater than the first height.

5. The test contactor of claim 4, wherein the second height is at least twice the height of the first height.

6. The test contactor of claim 5, wherein the conductive material is aluminum.

7. The test contactor of claim 6, wherein the non-conductive material is an anodized coating of the aluminum.

8. The test contactor of claim 7, wherein the anodized coating has a thickness of about 35 microns to about 50 microns.

9. The test contactor of claim 1, wherein the conductive material is aluminum.

10. The test contactor of claim 9, wherein the non-conductive material is an anodized coating of aluminum.

11. The test contactor of claim 1, wherein the at least one block defines a plurality of walls of the well and a gap between adjacent walls.

12. A test contactor comprising:
a base layer having a plurality of conductive posts extending therethrough;
a plurality of blocks on the base layer, each block comprising a conductive material having a first height and non-conductive material covering the conductive material, each block defining at least one wall of a well to receive a device to be tested having a second height, the conductive material of each block being connected to at least one of the conductive posts, a surface of the base layer defining a floor of the well, the first height being greater than the second height; and
a plurality of electrical connectors supported by the base layer and adjacent to the well to electrically couple the device to be tested to test circuitry.

13. The test contactor of claim 12, wherein each block is separated from an adjacent block and each block defines a separate wall of the well, the blocks defining spaces between the walls and each block having a respective electrical contact extending therefrom to be coupled to ground.

14. The test contactor of claim 13, wherein the plurality of blocks are connected by embedded conductive material.

15. The test contactor of claim 14, wherein the second height is at least twice as large as the first height.

16. The test contactor of claim 15, wherein the conductive material is aluminum.

17. The test contactor of claim 16, wherein the first non-conductive material is an anodized coating of aluminum.

18. The test contactor of claim 15, wherein the second non-conductive material is a plastic.

19. The test contactor of claim 12, wherein the electrical contacts are pins extending into the well.

* * * * *